US006992014B2

United States Patent
(12) United States Patent
Grant et al.

(10) Patent No.: US 6,992,014 B2
(45) Date of Patent: Jan. 31, 2006

(54) METHOD AND APPARATUS FOR ETCH RATE UNIFORMITY CONTROL

(75) Inventors: Casey J. Grant, Hinesburg, VT (US); Joel M. Sharrow, South Hero, VT (US); John J. Snyder, Woodstock, CT (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 10/065,720

(22) Filed: Nov. 13, 2002

(65) Prior Publication Data

US 2004/0092128 A1 May 13, 2004

(51) Int. Cl.
*H01L 21/302* (2006.01)
*H01L 21/461* (2006.01)

(52) U.S. Cl. ....................... 438/745; 438/747; 438/748

(58) Field of Classification Search ........ 438/745–748, 438/753–757; 156/342.52, 342.53, 345.11, 156/345.14, 345.17, 345.21, 345.27
See application file for complete search history.

(56) References Cited

U.S. PATENT DOCUMENTS

| | | | | |
|---|---|---|---|---|
| 4,903,717 A * | 2/1990 | Sumnitsch | ................. | 134/99.1 |
| 5,213,349 A | 5/1993 | Elliott | ........................ | 279/128 |
| 5,294,778 A | 3/1994 | Carman et al. | ............. | 219/385 |
| 5,320,982 A | 6/1994 | Tsubone et al. | ............ | 437/228 |
| 5,567,267 A | 10/1996 | Kazama et al. | ............. | 156/345 |
| 5,580,607 A * | 12/1996 | Takekuma et al. | .......... | 427/240 |
| 5,636,098 A | 6/1997 | Salfelder et al. | ............ | 361/234 |
| 5,846,375 A * | 12/1998 | Gilchrist et al. | ....... | 156/345.52 |
| 6,107,608 A * | 8/2000 | Hayes | ..................... | 219/444.1 |
| 6,274,505 B1 * | 8/2001 | Ito et al. | ..................... | 438/745 |
| 6,322,626 B1 * | 11/2001 | Shirley | ........................ | 118/73 |
| 6,586,161 B2 * | 7/2003 | Futase et al. | ............... | 430/311 |
| 6,695,922 B2 * | 2/2004 | Kitano et al. | ............... | 118/667 |
| 2002/0050244 A1 * | 5/2002 | Engesser | ..................... | 118/20 |

FOREIGN PATENT DOCUMENTS

JP 11-6081 * 1/1999

* cited by examiner

*Primary Examiner*—Duy-Vu N. Deo
(74) *Attorney, Agent, or Firm*—Schmeiser, Olsen & Watts; Anthony Canale

(57) ABSTRACT

A method for controlling a process on a substrate. The method comprising: providing the substrate, the substrate having an upper surface, an opposite lower surface and an edge between the upper and lower surfaces; processing the upper surface of the substrate with a first fluid; directing a second fluid against a portion of the lower surface proximate to the edge of the substrate, wherein the second fluid flows adjacent to the edge of the substrate; and controlling the temperature of the second fluid in order to affect a processing of an edge region of the upper side of the substrate.

14 Claims, 3 Drawing Sheets

METHOD AND APPARATUS FOR ETCH RATE UNIFORMITY CONTROL

BACKGROUND OF THE INVENTION

1. Field of the Invention

The present invention relates to the field of etching substrates generally and semiconductor substrates in particular; more specifically, it relates to a method of controlling the etch rate uniformity of a substrate and an apparatus for implementing the method.

2. Background of the Invention

Controlling defects during semiconductor processing and manufacturing is critical to achieving working devices in high yields. Historically the focus has been primarily on controlling defects which predominately originate from causes or foreign material on the front side (the side the devices are fabricated on) of the semiconductor substrate or wafer. An increased focus on understanding the impact on frontside devices from backside damage and backside defects is now commonplace in the semiconductor industry.

One effort to reduce backside damage and backside defects is to use wafer chucks that minimize contact with the backside of the wafer during processing. However, such chucks often have adverse effects on wafer processes such as etching and stripping that can cause other types of defects or adversely effect yield. These effects must be understood and minimized.

BRIEF SUMMARY OF THE INVENTION

SUMMARY OF THE INVENTION

A first aspect of the present invention is a method for controlling a process on a substrate comprising: providing the substrate, the substrate having an upper surface, an opposite lower surface and an edge between the upper and lower surfaces; processing the upper surface of the substrate with a first fluid; directing a second fluid against a portion of the lower surface proximate to the edge of the substrate, wherein the second fluid flows adjacent to the edge of the substrate; and controlling the temperature of the second fluid in order to affect a processing of an edge region of the upper side of the substrate.

A second aspect of the present invention is a method for processing a substrate having an upper surface, an opposite lower surface and an edge between the upper and lower surfaces, comprising: providing a chuck for elevating the substrate above an upper surface of the chuck using a suspension fluid, the suspension fluid delivered from an annular opening in the upper surface of the chuck, the annular opening located proximate to an edge of the chuck, the suspension fluid in contact with the lower surface of the substrate proximate to the edge of the substrate; delivering a processing fluid to the upper surface of the substrate; and maintaining the temperature of the suspension fluid at a temperature different from an ambient temperature while delivering the processing fluid.

A third aspect of the present invention is an apparatus for processing a substrate having an upper surface, an opposite lower surface and an edge between the upper and lower surfaces, comprising: a chuck for elevating the substrate above an upper surface of the chuck using a suspension fluid, the suspension fluid delivered from an annular opening in the upper surface of the chuck, the annular opening located proximate to an edge of the chuck, the suspension fluid in contact with the lower surface of the substrate proximate to the edge of the substrate; a fluid delivery located above the upper surface of the substrate for delivering a processing fluid to the upper surface of the substrate; and means for changing the temperature of the suspension fluid from an ambient temperature prior to the suspension fluid exiting the annular opening.

BRIEF DESCRIPTION OF THE SEVERAL VIEWS OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purposes of the present invention, fluids are defined as liquids, gases, and any flowable material. The term etch fluid is intended to encompass the term etchant and etchant medium. The term rinse fluid is intended to encompass the term rinse medium. The term drying fluid is intended to encompass the term drying medium. The term suspension gas is intended to encompass the term suspension medium. The terms wafer and substrate may be used interchangeably, a wafer being a particular type of substrate. The term ambient temperature is defined as the temperature of the surrounding atmosphere. Ambient temperature includes the common term "room temperature," generally about 68 to 70Â° F. The term ambient pressure is defined as the pressure of the surrounding atmosphere. Ambient pressure includes the common term "room pressure," generally around 1 atmosphere.

Figure 1:
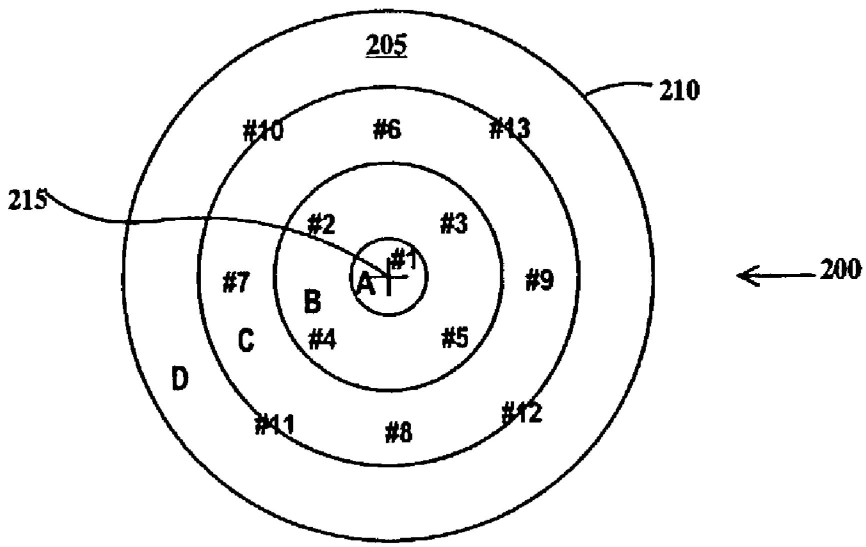
FIG. 1 is a schematic representation of a semiconductor wafer used in an etch experiment conducted by the inventors.
Figure 2:
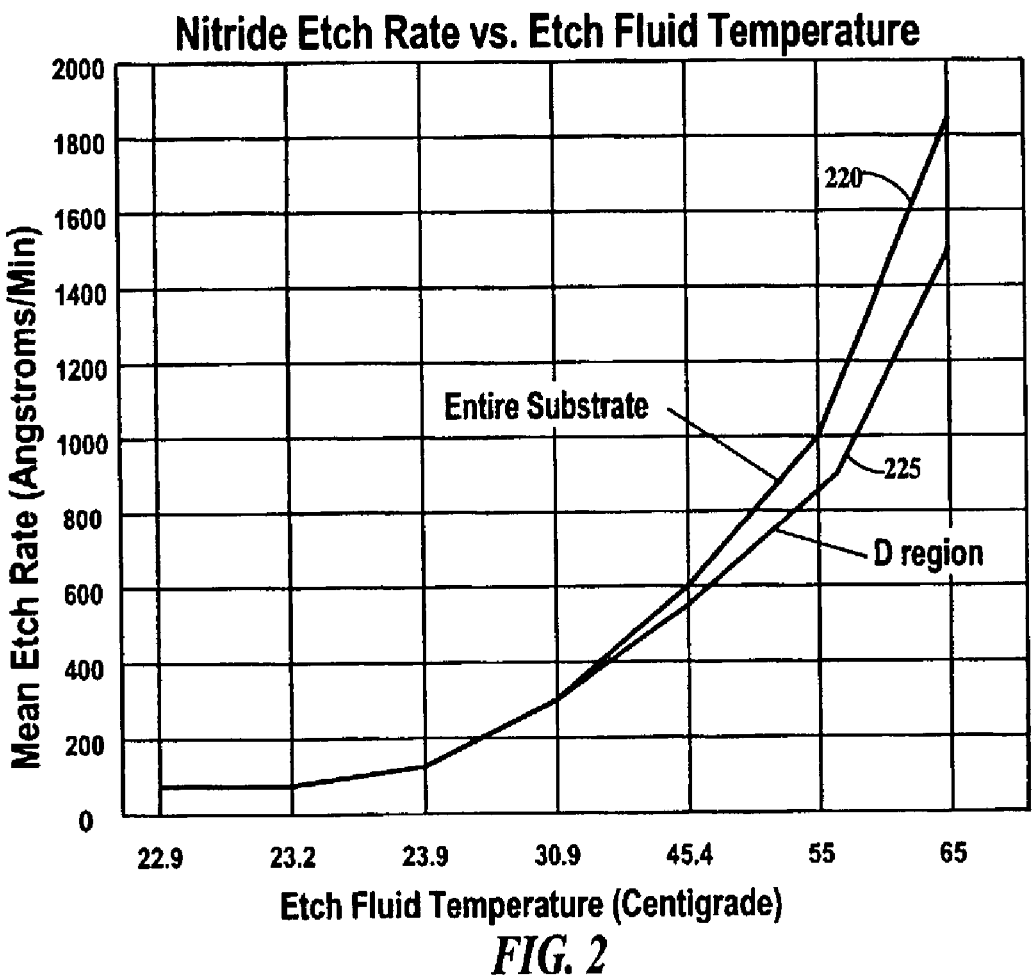
FIG. 2 is a chart illustrating the results of the experiment conducted using wafers illustrated in FIG. 1.

The inventors observed that silicon nitride etching was non-uniform across wafers when using the etch system illustrated in FIGS. 1 and 2 and described supra. The inventors conducted an etch experiment to determine the cause of the non-uniformity.

FIG. 1 is a schematic representation of a semiconductor wafer used in the etch experiment conducted by the inventors. In FIG. 1, wafer 200 has an upper surface 205 and an edge 210. Wafer 200 is divided into four regions, A, B, C and D progressing sequentially outward from a center 215 of upper surface 205 to edge 210. Region A is a circular region of an upper surface 205 centered on center 215 of wafer 200. Regions B, C, and D are annular rings about region A. Region A includes one measurement site (#1), region B includes four measurement sites (#2, #3, #4 and #5), region C includes four measurement sites (#6, #7, #8 and #9) and region D is an edge region and includes four measurement sites (#10, #11, #12 and #13). Measurement sites #1–#13 were used to measure the etch rate of a material deposited on upper surface 205 of wafer 200. Wafer 200 is a 200 mm diameter silicon wafer having a thickness of about 705–745 um and region D extends a distance of about 33 mm from edge 210.

The following experiment was performed to determine the uniformity of the etch rate in a system using a Bernoulli type chuck. A silicon nitride film was deposited on the upper surface of series of test wafers as illustrated in FIG. 1 and described supra. Seven wafers were etched in an etch fluid consisting of 49% hydrofluoric acid (HF). For each wafer, the HF was dispensed at a different temperature onto the wafer while it was spinning. For each wafer, the HF was dispensed for the same fixed amount of time. After rinsing and drying, the amount of silicon nitride removed in each test site of each wafer was measured and an etch rate determined. The etchant temperatures were 22.9Â° C., 23.2Â° C., 23.9Â° C., 30.9Â° C., 45.4Â° C., 55.0Â° C. and 65.0Â° C. The suspension fluid introduced into bore 360 (see FIG. 3) was $N_2$ gas a flow rate of 120 L/min+/− 10 L/min at ambient temperature (approx 30Â° C.). The experiment was performed using a SEZ Spin Etch Processor manufactured by The SEZ group, Villach, Austria.

FIG. 2 is a chart illustrating the results of the experiment conducted on wafers illustrated in FIG. 1. In FIG. 2, the mean etch rate of all 13 measurement sites vs. HF etch temperature are plotted in curve 220 and the mean etch rate for the four measurement sites (#10–#13) in the "D" region vs. HF etch temperature are plotted in curve 225. FIG. 2 clearly indicates that at etch fluid temperatures above 30.9Â° C., the etch rate in the "D" region of the wafer slows down, introducing a non-uniformity into the etch process. The inventors believe that this non-uniformity is caused by cooling of the "D" region, relative to the "A," "B" and "C" regions of the upper surface of the wafer caused by the high flow rate of suspension fluid past the lower surface of the wafer below "D" region near the edge of the wafer. The cooler "D" region in turn cools the etch fluid as it passes over the "D" region and thus reduces the etch rate in the "D" region.

By supplying suspension gas at a temperature that will increase the temperature of the "D" region, the cooling effect of the suspension fluid may be compensated. Thus, the etch rate in the "D" region may be adjusted to match the etch rate in the "A," "B," and "C" regions.

Figure 3:
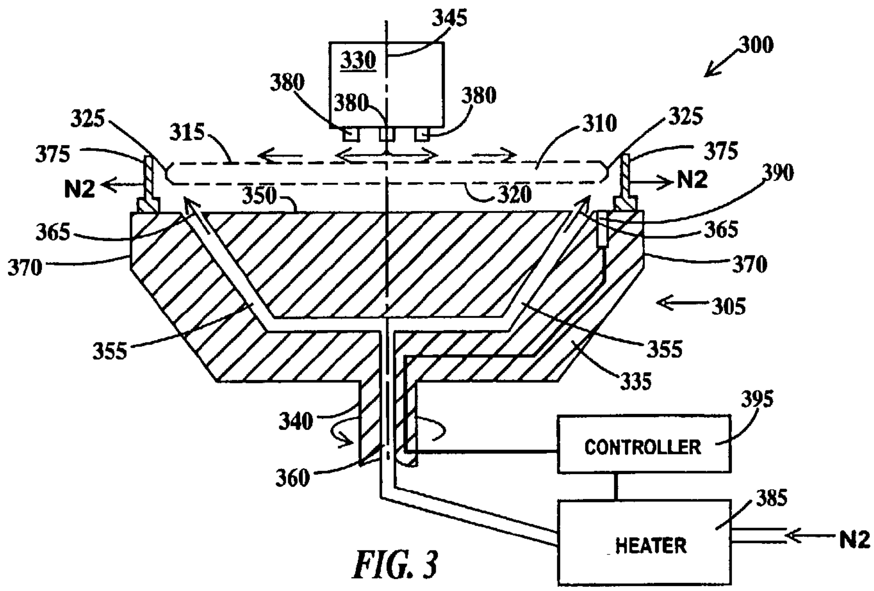
FIG. 3 is schematic diagram of an etch system including a cross-sectional side view of a Bernoulli wafer chuck according to a first embodiment of the present invention.

FIG. 3 is schematic diagram of an etch system including a cross-sectional side view of a Bernoulli wafer chuck according to a first embodiment of the present invention. In FIG. 3, etch system 300 includes a Bernoulli chuck 305 for holding a wafer 310 (which may be a semiconductor wafer/substrate) having an upper surface 315 a lower surface 320 and an edge 325 and a dispense head 330 for dispensing processing fluids such as etch, rinse and drying fluids on the upper surface of the wafer.

Bernoulli chuck 305 includes a chuck body 335 and a shaft 340 for rotating the Bernoulli chuck about a central axis 345 transverse to an upper surface 350 of the Bernoulli chuck. Shaft 340 may be rotated, for example, by an air motor or an electric motor. Chuck body 335 includes passages 355 connected to a bore 360 in shaft 340 and terminating in an annular opening 365 in upper surface 350 near an edge 370 of the chuck body. Annular opening 365 has a diameter slightly less than the diameter of wafer 310 and is located close to edge 370 of chuck body 305. Protruding from upper surface 350 of Bernoulli chuck 305 between annular opening 365 and edge 370 are a multiplicity of pins 375 for keeping wafer 310 from sliding away from the Bernoulli chuck and to lock the wafer in place when spinning is performed.

Etch system 300 further includes a heater 385 for heating the suspension fluid to a temperature above ambient temperature. A temperature sensor 390 is embedded in upper surface 350 of chuck body 305 immediately adjacent to annular opening 365 for measuring the temperature of the suspension fluid near edge 320 of wafer 310. A controller 395 for displaying the temperature reading of temperature sensor 390 is electrically connected to the temperature sensor and optionally electrically connected to heater 385 for controlling the suspension fluid temperature to a predetermined temperature at the edge of wafer 310.

In operation, a suspension fluid such as nitrogen gas at a high flow rate and at ambient temperature is introduced to heater 385 where the fluid is heated, is forced into bore 360, travels to annular opening 365 via passages 355, contacts lower surface 320 of wafer 310 and escapes into the surrounding area by passing between edge 325 of wafer 310 and edge 370 of Bernoulli chuck 305, thus suspending the wafer above upper surface 350 of the Bernoulli chuck. Etch, rinse and drying fluids are dispensed from dispenser 330 via dispensers 380 and flow, and are forced by centrifugal force when Bernoulli chuck 305 is rotated, across upper surface 315 of wafer 310 and flow off the wafer at edge 325. Etch, rinse and drying fluids may be liquids or gases. These etch, rinse and drying fluids may be above, at or below ambient temperature. Except for elevated pressure required to dispense processing fluids and force the suspension fluid though chuck 305, system 300 operates at ambient pressure.

Figure 4:
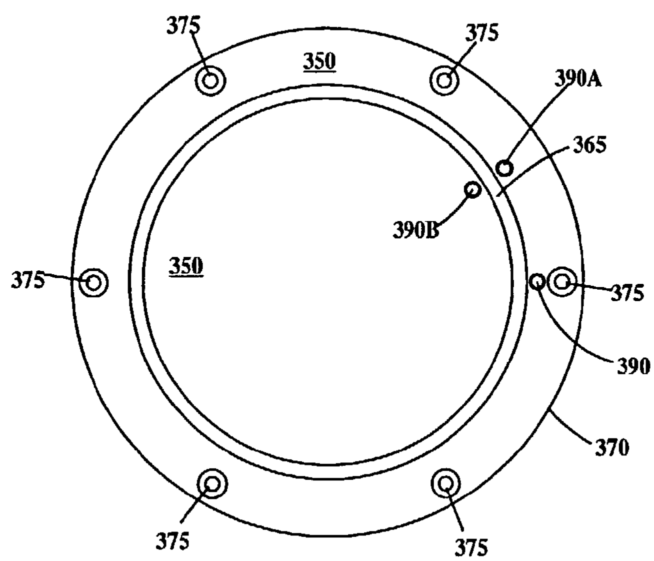
FIG. 4 is a top view of the Bernoulli wafer chuck of FIG. 3.

FIG. 4 is a top view of the Bernoulli wafer chuck of FIG. 3. In FIG. 3, six spring loaded pins 375 are evenly arranged on upper surface 350 of Bernoulli chuck 305 between annular opening 365 and edge 370. More or less pins may be used. Temperature sensor 390 is illustrated as located between annular opening 365 and one of pins 375. Temperature sensor 390A illustrates a first alternative temperature sensor location between annular opening 365 and edge 370 of body 305 away from any pins 375 for the temperature sensor. Temperature sensor 390B illustrates a second alternative temperature sensor location interior to annular opening 365 the temperature sensor. Temperature sensor 390 should be located under the "D" region of the wafer or stated another way; the temperature sensor should be located to sense the temperature of the suspension fluid at edge 325 or very near the edge of wafer 310 so as to sense the temperature of the suspension fluid as the suspension fluid flows past the edge of the wafer.

In a first application of the first embodiment of the present invention, the suspension fluid is heated to a temperature high enough so that the temperature of edge 320 of wafer 310 is substantially the same as the rest of the wafer. In terms of FIG. 1, the suspension fluid is heated to a temperature high enough so that the temperature of the "D" region is substantially the same as the temperature of the "A," "B" and "C" regions of the wafer. The first application of the first embodiment of the present invention is useful for processes where the same etch rate near the edge of the substrate as the rest of the substrate is desired, for example, to form devices having predetermined near identical parametric and electrical characteristics on the same wafer. Suitable suspension fluids include $N_2$, Ar, He, and compressed air.

In one example, an etch fluid comprising 49% HF at 55Â° C. and at a flow rate of 0.8–1 liters/min (L/min) is dispensed on a spinning, silicon nitride coated wafer. The suspension fluid is $N_2$ at a flow rate of 120 L/min.+/−10 L/min. (measured at the source of the $N_2$ to heater 385) and is heated to 55–58Â° C. measured at the temperature sensor. The heated suspension fluid maintains the wafer edge at a temperature consistent with that of the etch fluid, offsetting any cooling of the etch fluid at the edge of the wafer.

In a second application of the first embodiment of the present invention, the suspension fluid is heated to a temperature high enough so that the temperature of edge 320 of wafer 310 is substantially greater then the rest of the wafer. In terms of FIG. 1, the suspension fluid is heated to a temperature high enough so that the temperature of the "D" region is greater then the temperature of the "A," "B" and "C" regions of the wafer would have reached if ambient temperature suspension fluid was used. The second application of the first embodiment of the present invention useful for processes where a higher etch rate near the edge of the substrate then the rest of the substrate is desired, for example, to form devices having different parametric and electrical characteristics on the same wafer or to remove a film that is thicker at the edge of the wafer than in the interior of the wafer.

In one example, an etch fluid comprising HF/Ethylene Glycol (4% by weight HF) at 82Â° C. and at a flow rate of 1.5–2 L/min. is dispensed on a spinning wafer with silicon nitride and silicon oxide structures exposed. The silicon nitride material is LPCVD nitride and the oxide is thermal oxide. It is common for nitride depositions to be thicker on the edge of the wafer, and it is well known that subsequent planarization effects can also add to this non-uniformity. The suspension fluid is $N_2$ at a flow rate of 120 L/min.+/−10 L/min. (measured at the source of the $N_2$ to heater 385) and is heated to 95–100Â° C. measured at the temperature sensor. The heated suspension fluid maintains the edge of the wafer at a temperature higher that of the rest the wafer, effectively heating up the etch fluid as it reaches the edge of the wafer. This local heating of the etch fluid increase the etch rate of both the thermal oxide and the silicon nitride structures at the edge of the wafer, offsetting the greater thickness of the silicon nitride at the edge and resulting in uniform film removal across the wafer without over or under etched regions. At elevated temperatures, care must be made to select a material for Bernoulli chuck 305 that is compatible with the temperature of the suspension fluid not only at the temperature sensor 390 but also at the temperature at which it leaves heater 385 which may be somewhat higher.

Figure 5:
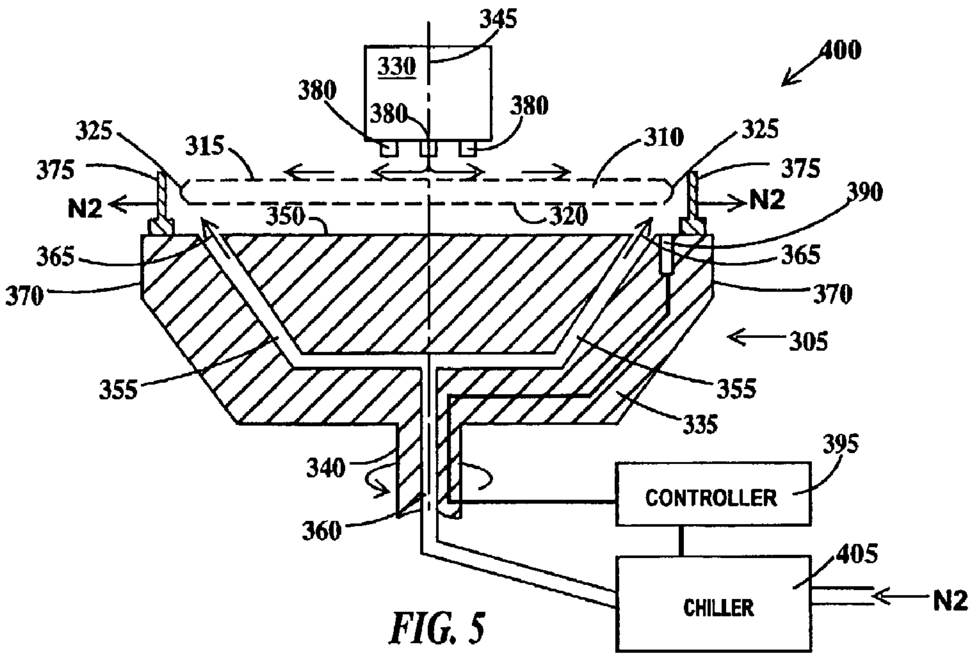
FIG. 5 is schematic diagram of an etch system including a cross-sectional side view of a Bernoulli wafer chuck according to a second embodiment of the present invention.

FIG. 5 is schematic diagram of an etch system including a cross-sectional side view of a Bernoulli wafer chuck according to a second embodiment of the present invention. Etch system 400 of FIG. 5 is essentially identical to etch system 300 of FIG. 3, except that heater 385 of FIG. 3 is replaced with a chiller 405.

In operation, a suspension fluid such as nitrogen gas at a high flow rate and at ambient temperature is introduced to chiller 405 where the fluid is cooled, is forced into bore 360, travels to annular opening 365 via passages 355, contacts lower surface 320 of wafer 310 and escapes into the surrounding area by passing between edge 325 of wafer 310 and edge 370 of Bernoulli chuck 305, thus suspending the wafer above surface 350 of the Bernoulli chuck. Etch, rinse and drying fluids are dispensed from dispenser 330 via dispensers 380 and flow, and are forced by centrifugal force when Bernoulli chuck 305 is rotated, across upper surface 315 of wafer 310 and flow off the wafer at edge 320. Etch, rinse and drying fluids may be liquids or gases. These etch, rinse and drying fluids may be above, at or below ambient temperature. Except for elevated pressure required to dispense processing fluids and force the suspension fluid though chuck 305, system 400 operates at ambient pressure.

The suspension fluid is cooled to a temperature low enough so that the temperature of edge 320 of wafer 310 is substantially lower than the rest of the wafer and lower than that which would have been obtained without cooling the suspension fluid, i.e. then would have been obtained using a suspension fluid supplied at ambient temperature. In terms of FIG. 1, the suspension fluid is cooled to a temperature low enough so that the temperature of the "D" region is substantially less than the temperature of the "A," "B" and "C" regions of the wafer. The second embodiment of the present invention is useful for processes where a substantially lower or no etch rate near the edge of the substrate as compared to the rest of the substrate is desired.

In one example, an etch fluid comprising 49% HF at 55Â° C. and at a flow rate of 0.8–1 L/m is dispensed on the backside of a spinning, inter-level dielectric (ILD) coated wafer. The ILD material is undoped silica glass (USG) capped with silicon nitride. One feature of an ILD film is the accumulation of ILD films on the beveled edge of the wafer. The suspension fluid is $N_2$ at a flow rate of 120 L/min.+/−10 L/min. (measured at the source of the $N_2$ to heater 385) and is cooled to 0–1Â° C. measured at the temperature sensor. The cooled suspension fluid maintains the edge of the wafer at a temperature much lower that of the rest the wafer, effectively cooling down the etch fluid as it reaches the edge of the wafer. This local cooling of the etch fluid decreases the etch rate of ILD at the edge of the wafer, preserving the ILD at the edge of the wafer while processing the backside of the wafer. Applications include backside cleaning/etching.

Figure 6:
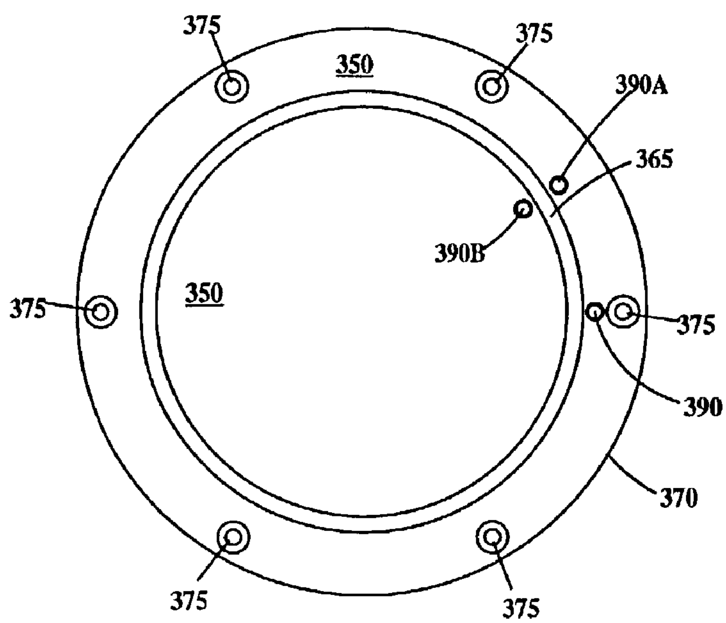
FIG. 6 is a top view of the Bernoulli wafer chuck of FIG. 5.

FIG. 6 is a top view of the Bernoulli wafer chuck of FIG. 5. FIG. 6 is essentially identical to FIG. 4.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, a single etch system could include both a heater and a chiller, with an arrangement of valves to direct the suspension fluid to either the heater or the chiller depending upon the process. Further, the invention is not limited to semiconductor substrates, round substrates, or substrates of any particular material. The Bernoulli chuck may or may not be spinning during the etch, rinse or dry steps. Therefore, it is intended that the following claims cover all such modifications and changes as fall within the true spirit and scope of the invention.

What is claimed is:

1. A method for controlling a process on a substrate comprising:

providing the substrate, the substrate having an upper surface, an opposite lower surfaces and an outer edge between the upper and lower surfaces;

processing the upper surface of the substrate with a first fluid;

directing a second fluid against a portion of the lower surface proximate to the outer edge of the substrate, wherein said second fluid flows adjacent to the outer edge of the substrate, and wherein said second fluid further flows toward the outer edge of the substrate while in direct contact with the lower surface of the substrate; and controlling the temperature of said second fluid in order to affect a processing of an edge region of the upper surface of the substrate.

2. The method of claim 1 wherein the substrate is a semiconductor wafer.

3. The method of claim 1, wherein the second fluid comprises a gas.

4. The method of claim 1 wherein controlling the temperature of said second fluid comprises increasing the temperature of the second fluid above an ambient temperature.

5. The method of claim 1, wherein processing the upper surface of the substrate comprises etching said upper surface.

6. The method of claim 1, further including rotating the substrate.

7. The method of claim 1, further comprising providing a temperature sensor that measures the temperature of the second fluid near the outer edge of the substrate.

8. The method of claim 7, further comprising providing a controller for displaying the temperature measured by the temperature sensor, said controller being electrically connected to the temperature sensor.

9. The method of claim 8, wherein controlling the temperature of the second fluid comprises heating or cooling the second fluid by a thermal device that is electrically connected to the controller, said thermal device being a heater or a chiller.

10. A method for processing a substrate having an upper surface, an opposite lower surface and an outer edge between the upper and lower surfaces, comprising:

providing a chuck for elevating the substrate above a top surface of said chuck using a suspension fluid, said suspension fluid delivered from an annular opening in said upper surface of said chuck, said annular opening located proximate to an edge of said chuck, said suspension fluid flowing toward the outer edge of the substrate while in direct contact with the lower surface of the substrate proximate to the outer edge of the substrate;

delivering a processing fluid to the upper surface of the substrate; and maintaining the temperature of said suspension fluid at a temperature different from an ambient temperature while delivering said processing fluid.

11. The method of claim 10, further including rotating said chuck.

12. The method of claim 10, further comprising providing a temperature sensor that measures the temperature of the suspension fluid near the outer edge of the substrate.

13. The method of claim 12, further comprising providing a controller for displaying the temperature measured by the temperature sensor, said controller being electrically connected to the temperature sensor.

14. The method of claim 12, wherein maintaining the temperature of the suspension fluid comprises heating or cooling the suspension fluid by a thermal device that is electrically connected to the controller, said thermal device being a heater or a chiller.

* * * * *